(12) United States Patent
Kim et al.

(10) Patent No.: US 12,727,496 B2
(45) Date of Patent: Sep. 1, 2026

(54) SEMICONDUCTOR PACKAGE INCLUDING A PAD COMPRISING A CONNECTION PORTION CONNECTING A FIRST AND SECOND PAD PORTIONS

(71) Applicant: SAMSUNG ELECTRONICS CO., LTD., Suwon-si (KR)

(72) Inventors: Jaesun Kim, Suwon-si (KR); Sanghyun Lee, Suwon-si (KR); Yeonho Jang, Suwon-si (KR); Yunseok Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 540 days.

(21) Appl. No.: 18/323,646

(22) Filed: May 25, 2023

(65) Prior Publication Data

US 2024/0096777 A1 Mar. 21, 2024

(30) Foreign Application Priority Data

Sep. 15, 2022 (KR) ........................ 10-2022-0116320

(51) Int. Cl.
*H10W 70/65* (2026.01)
*H10P 74/20* (2026.01)
(Continued)

(52) U.S. Cl.
CPC ........... *H10W 70/65* (2026.01); *H10P 74/203* (2026.01); *H10P 74/207* (2026.01);
(Continued)

(58) Field of Classification Search
CPC ... H01L 22/12; H01L 22/14; H01L 23/49838; H01L 23/49822; H01L 23/49816;
(Continued)

(56) References Cited

U.S. PATENT DOCUMENTS 7,221,173 B2 5/2007 Bachman et al.
9,735,121 B2 8/2017 Jo et al.
(Continued)

FOREIGN PATENT DOCUMENTS

JP 2001343426 A 12/2001
JP WO2012/035688 A1 1/2014
(Continued)

*Primary Examiner* — Khiem D Nguyen
(74) *Attorney, Agent, or Firm* — Wolf, Greenfield & Sacks, P.C.

(57) ABSTRACT

A semiconductor package includes a redistribution structure in which redistribution layers and insulating layers are alternately stacked. A semiconductor chip is electrically connected to the redistribution layers, and bumps are electrically connected to the redistribution layers and arranged on one surface of the redistribution structure. The redistribution layers include pads arranged to face the bumps, and each of the pads includes a first pad portion offset from a center of each of the pads in a first direction, a second pad portion offset from the center of each of the pads in a second direction, and a connection portion connecting the first and second pad portions. The connection portion includes a protruding portion that defines a first recessed region recessed adjacent to the first pad portion and a second recessed region recessed adjacent to the second pad portion.

20 Claims, 10 Drawing Sheets

(51) Int. Cl.

| | |
|---|---|
| ***H10W 70/685*** | (2026.01) |
| ***H10W 74/15*** | (2026.01) |
| ***H10W 90/00*** | (2026.01) |
| ***H10W 90/20*** | (2026.01) |
| *H10W 72/00* | (2026.01) |

(52) U.S. Cl.

CPC ......... *H10W 70/685* (2026.01); *H10W 90/00* (2026.01); *H10W 90/297* (2026.01); *H10W 72/07232* (2026.01); *H10W 72/07236* (2026.01); *H10W 74/15* (2026.01); *H10W 90/722* (2026.01); *H10W 90/724* (2026.01); *H10W 90/732* (2026.01); *H10W 90/734* (2026.01)

(58) Field of Classification Search

CPC ......... H01L 24/16; H01L 24/32; H01L 24/73; H01L 24/81; H01L 25/18; H10W 70/65; H10W 72/07232; H10W 72/90; H10W 90/701; H10W 72/29; H10W 72/923; H10W 72/936; H10P 74/203; H10P 74/207; H10P 74/277

See application file for complete search history.

(56) References Cited

U.S. PATENT DOCUMENTS

| | | | | |
|---|---|---|---|---|
| 9,829,507 | B2 | 11/2017 | Saito | |
| 10,818,601 | B1 | 10/2020 | Deguchi et al. | |
| 2012/0129334 | A1* | 5/2012 | Chung | H01L 24/03 438/653 |
| 2016/0118333 | A1 | 4/2016 | Lin | |
| 2016/0225706 | A1* | 8/2016 | Cho | H01L 24/16 |
| 2020/0194362 | A1* | 6/2020 | Park | H01L 23/49816 |
| 2022/0037294 | A1* | 2/2022 | Hwang | H01L 21/4853 |

FOREIGN PATENT DOCUMENTS

| | | | |
|---|---|---|---|
| KR | 20100002873 | A | 1/2010 |
| KR | 10-2022-0026809 | A | 3/2022 |

* cited by examiner number 2,000
1,500
1,000
500
0

0.00 0.25 0.50 0.75 1.00 1.25 1.50 1.75 2.00

Rp(ohm) by tester1

100e

120b 112 113 111 130c 115b 160 140c

110b

Z

Y

SEMICONDUCTOR PACKAGE INCLUDING A PAD COMPRISING A CONNECTION PORTION CONNECTING A FIRST AND SECOND PAD PORTIONS

CROSS-REFERENCE TO RELATED APPLICATION(S)

This application claims priority under 35 USC § 119(a) to Korean Patent Application No. 10-2022-0116320 filed on Sep. 15, 2022 in the Korean Intellectual Property Office, the entire disclosure of which is incorporated herein by reference in its entirety.

BACKGROUND

The present inventive concept relates to semiconductor packages.

In general, a semiconductor chip may be implemented as a semiconductor package such as a wafer level package (WLP) or a panel level package (PLP), and the semiconductor package may be used as an electronic component of a device.

A semiconductor package may include a redistribution layer for electrically connecting a semiconductor chip to a device. The redistribution layer may have a structure in which redistribution structures implemented to be finer than wirings of a wiring layer of a general printed circuit board are horizontally extended, and may be electrically connected to a bump to vertically extend an electrical connection path.

As technology develops, the degree of integration of semiconductor chips gradually increases, and line widths of redistribution lines, intervals between redistribution lines, or intervals between bumps are gradually narrowing. Accordingly, the reliability of the electrical connection path of semiconductor packages is becoming increasingly important, and the efficiency of measuring the reliability is also becoming increasingly important.

SUMMARY

Example embodiments provide semiconductor packages in which reliability of measurement efficiency for an electrical connection path may be improved.

According to example embodiments, a semiconductor package includes a redistribution structure in which at least one redistribution layer and at least one insulating layer are alternately stacked; a semiconductor chip is electrically connected to the at least one redistribution layer; and a plurality of bumps are electrically connected to the at least one redistribution layer and arranged on a first surface of the redistribution structure. The at least one redistribution layer includes a plurality of pads arranged to face the plurality of bumps, and each of the pads includes a first pad portion offset in a first direction from a center of the pad and arranged to face one of the plurality of bumps; a second pad portion offset from the center of the pad in a second direction different from the first direction; and a connection portion connecting the first and second pad portions, and including a protruding portion that defines a first recessed region adjacent to the first pad portion and a second recessed region adjacent to the second pad portion.

According to example embodiments, a semiconductor package includes a redistribution structure in which at least one redistribution layer and at least one insulating layer are alternately stacked; a semiconductor chip is electrically connected to the at least one redistribution layer; and a plurality of bumps are electrically connected to the at least one redistribution layer and arranged on one surface of the redistribution structure. The at least one redistribution layer includes a plurality of pads arranged to face the bumps, and a surface of each of the pads that faces the plurality of bumps has an aspect ratio greater than 2 and first and second grooves.

According to example embodiments, a semiconductor package includes a redistribution structure in which at least one redistribution layer and at least one insulating layer are alternately stacked; a semiconductor chip is electrically connected to the at least one redistribution layer; and a plurality of bumps are electrically connected to the at least one redistribution layer and arranged on one surface of the redistribution structure. The at least one redistribution layer includes a plurality of pads arranged to face the plurality of bumps. A surface of each of the plurality of pads that faces the plurality of bumps has an aspect ratio exceeding 2, and a distance between adjacent ones of the plurality of bumps is shorter than a length of a major axis of each of the plurality of pads.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1A:
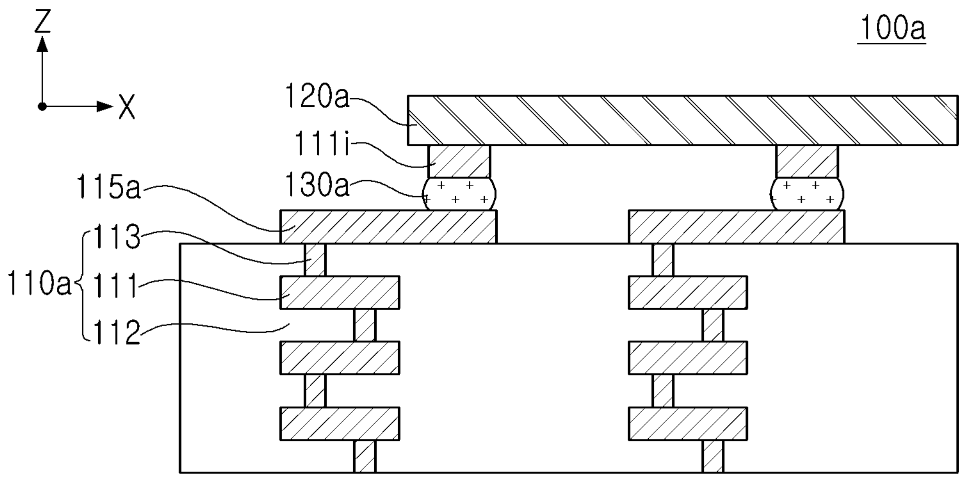
FIG. 1A is a cross-sectional view illustrating a semiconductor package according to an example embodiment.

Detailed description of the present inventive concept to be described later refers to the accompanying drawings which, by way of example, illustrate specific embodiments in which the present inventive concept may be practiced. These embodiments are described in sufficient detail to enable one skilled in the art to practice the present inventive concept. It should be understood that the various embodiments of the present inventive concept are different from each other but are not necessarily mutually exclusive. For example, one embodiment of specific shapes, structures, and characteristics described herein may be implemented in another embodiment without departing from the scope of the present inventive concept. Additionally, it should be understood that the location or arrangement of individual components within each disclosed embodiment may be changed without departing from the scope of the present inventive concept. Accordingly, the detailed description set forth below is not intended to be taken in a limiting sense, and the scope of the present inventive concept is limited only by the appended claims, with all equivalents as claimed by those claims. Like reference numbers in the drawings indicate the same or similar function throughout the various aspects.

Hereinafter, embodiments of the present inventive concept will be described in detail with reference to the accompanying drawings so that those skilled in the art may easily practice the present inventive concept.

FIG. 1A is a cross-sectional view illustrating a semiconductor package according to an example embodiment.

Referring to FIG. 1A, a semiconductor package 100*a* according to an example embodiment may include a redistribution structure 110*a*, a semiconductor chip 120*a*, and bumps 130*a*.

FIG. 1A shows a fan-out in which a portion of the redistribution structure 110*a* vertically overlaps (i.e., is directly beneath) the semiconductor chip 120*a* and the rest of the redistribution structure 110*a* does not vertically overlap (i.e., is not directly beneath) the semiconductor chip 120*a*. The structure is illustrated, but is not limited thereto. The fan-out structure may be extended to a Package on Package (POP) structure, or may be a System in Package (SIP) structure.

The redistribution structure 110*a* may have a structure in which at least one redistribution layer 111 and at least one insulating layer 112 are alternately stacked. The redistribution structure 110*a* may further include vias 113 electrically connected to at least one redistribution layer 111 and passing through at least one insulating layer 112.

At least one insulating layer 112 includes an insulating material, and may include, for example, a thermosetting resin such as epoxy resin or a thermoplastic resin such as polyimide. For example, at least one insulating layer 112 may include a photosensitive insulating material such as photo immersible dielectric (PID) resin. Alternatively, at least one insulating layer 112 may include a resin mixed with an inorganic filler, for example, Ajinomoto Build-up Film (ABF). Alternatively, at least one insulating layer 112 may include prepreg, flame retardant (FR-4), or bismaleimide triazine (BT). At least one insulating layer 112 may include the same or different materials, and depending on the material and process forming each layer, the boundary therebetween may not be distinguished.

The redistribution layers 111 and the vias 113 may form an electrical path. The redistribution layers 111 may be disposed in a line shape on the X-Y plane, and the vias 113 may have a cylindrical shape with side surfaces that are slanted toward the bottom or top and become narrow (i.e., the vias 113 may have a tapered configuration). The vias 113 are illustrated as a filled via structure in which the inside is completely filled with a conductive material, but is not limited thereto. For example, the vias 113 may have a conformal via shape in which a metal material is formed along the inner wall of the via hole.

The redistribution layers 111 and the vias 113 may include a conductive material, and for example, include copper (Cu), aluminum (Al), silver (Ag), tin (Sn), gold (Au), nickel (Ni), lead (Pb), titanium (Ti), or alloys thereof.

The semiconductor chip 120*a* may be electrically connected to at least one redistribution layer 111. The semiconductor chip 120*a* may be disposed on the redistribution structure 110*a*. For example, the semiconductor chip 120*a* may include a body portion containing a semiconductor material such as silicon (Si), germanium (Ge), or gallium arsenide (GaAs); and an element layer or an active layer disposed below the body and including an integrated circuit (IC). The semiconductor chip 120*a* may include a logic semiconductor chip and/or a memory semiconductor chip. The logic semiconductor chip may be a micro-processor, and examples include a Central Processing Unit (CPU), a Graphics Processing Unit (GPU), a Field Programmable Gate Array (FPGA), an Application Processor (AP), a Digital Signal Processor, a Cryptographic Processor, a controller, or an application specific integrated circuit (ASIC). The memory semiconductor chip may be a volatile memory such as dynamic random access memory (DRAM) or static random access memory (SRAM), or a non-volatile memory such as flash memory.

The semiconductor chip 120*a* may be mounted on the upper surface of the redistribution structure 110*a* using a flip-chip bonding method, and may include the connection pads lii disposed on the lower surface of the semiconductor chip 120*a*. For example, the connection pads 111*i* may include a conductive material such as tungsten (W), aluminum (Al), or copper (Cu), and may be a pad of a bare chip, for example, an aluminum (Al) pad, but may also be a pad of a packaged chip, for example, a copper (Cu) pad, according to embodiments.

The bumps 130*a* are electrically connected to at least one redistribution layer 111 and may be arranged on one surface (e.g., an upper surface) of the redistribution structure 110*a*. For example, the bumps 130*a* may have a ball or column shape, and may include solder containing tin (Sn) or an alloy (Sn—Ag—Cu) containing tin (Sn). The bumps 130*a* may have a relatively low melting point compared to other metal materials, and may thus be connected to and fixed to the pads 115*a* of the at least one redistribution layer 111 by a thermal compression bonding (TCB) process or a reflow process.

Figure 1B:
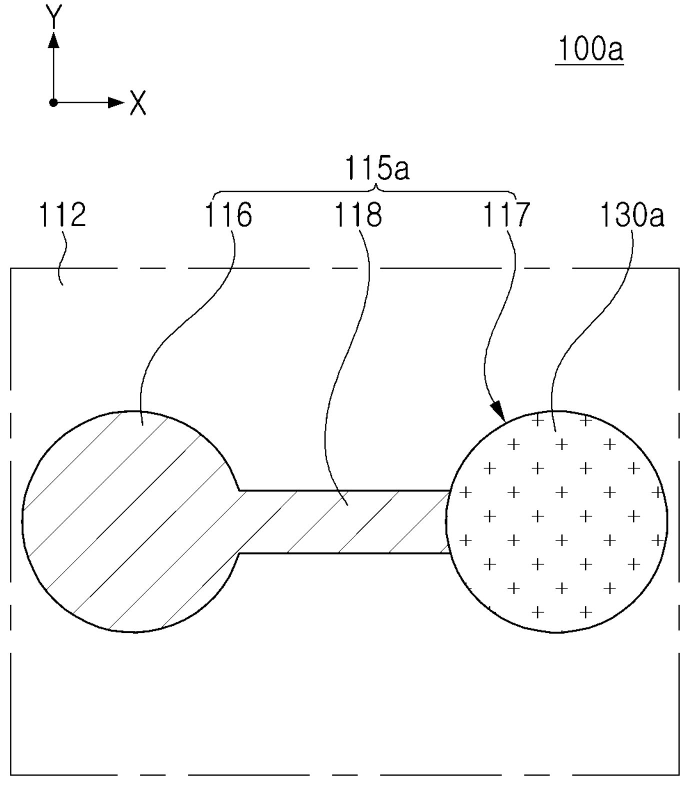
FIG. 1B is an enlarged plan view illustrating a pad of a semiconductor package according to an example embodiment.

FIG. 1B is an enlarged plan view illustrating a pad of a semiconductor package according to an example embodiment.

Referring to FIGS. 1A and 1B, at least one redistribution layer 111 may include pads 115*a* disposed to face bumps 130*a*, and each of the pads 115*a* may include a first pad portion 117, a second pad portion 116, and a connection portion 118.

The first pad portion 117 may be disposed to deviate (i.e., is offset) from the center of each of the pads 115*a* in a first direction (e.g., +X-direction) and face one of the bumps 130*a*. Accordingly, the first pad portion 117 may be designed to be efficient in providing a vertical connection path between the bumps 130*a* and the at least one redistribution layer 111. The first pad portion 117 may also be used for reliability measurement of an electrical connection path (e.g., redistribution layer, via).

The second pad portion 116 may be disposed to be biased (i.e., is offset) from the center of each of the pads 115*a* in a second direction (e.g., −X-direction) different from the first direction. The bumps 130*a* may not contact the second pad portion 116, and the second pad portion 116 may be used to measure the reliability of an electrical connection path (e.g., a redistribution layer or a via). Accordingly, each of the pads 115*a* may provide a plurality of reliability measurement points.

Since the contact of the first and second pad portions 117 and 116 with the bumps 130*a* may be different, the shape or size of the first and second pad portions 117 and 116 may be different depending on the design. For example, the shape of the upper surface of each of the first and second pad portions 117 and 116 is not limited to a circular shape.

The connection portion 118 may connect the first and second pad portions 117 and 116. Accordingly, a combination of the first and second pad portions 117 and 116 may be used as one pad.

Figure 1C:
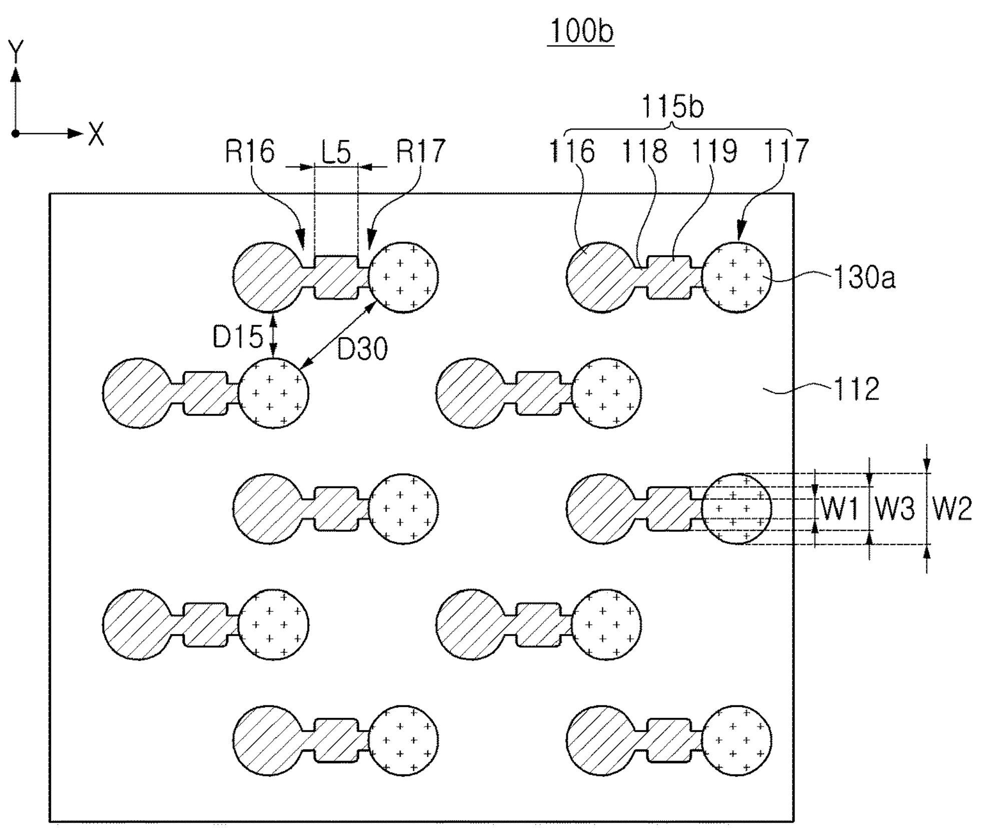
FIG. 1C is a plan view illustrating a semiconductor package according to an example embodiment.

FIG. 1C is a plan view illustrating a semiconductor package according to an example embodiment.

Referring to FIG. 1C, each connection portion 118 of the pads 115*b* of the semiconductor package 100*b* according to an example embodiment may include a protruding portion 119 to provide a first recessed region R17 recessed on the side of the first pad portion 117 and a second recessed region R16 recessed on the side of the second pad portion 116.

When the bumps 130*a* are formed on the first pad portion 117, they may be in a fluidity state by a TCB process or a reflow process. In this case, the protruding portion 119 may suppress overflow of the material of the bumps 130*a* to the second pad portion 116. Accordingly, the bumps 130*a* may be formed more concentrated in a space vertically overlapping the first pad portion 117.

Accordingly, reliability (e.g., strength, electrical characteristics) of the bumps 130*a* after formation may be further improved. That is, in the semiconductor package 100*b* according to an example embodiment, each of the pads 115*b* may provide a plurality of reliability measurement points while securing the reliability of the bumps 130*a*. The efficiency of reliability measurement for electrical connection paths (e.g. redistribution layers, vias) may be improved.

For example, since the width W3 of the protruding portion 119 may be greater than the width W1 of the connection portion 118, the connection portion 118 may have a shape in which the width is wider between the first and second depressed regions R17 and R16. For example, the width W1 of the connection portion 118 may be substantially the same as the line width of the redistribution layer.

For example, a width W3 between the first and second recessed regions R17 and R16 of the connection portion 118 may be smaller than the width W2 of the first pad portion 117. Accordingly, the protruding portion 119 may effectively prevent the material of the bumps 130*a* from overflowing without increasing the effective size of the pads 115*b*.

Figure 1D:
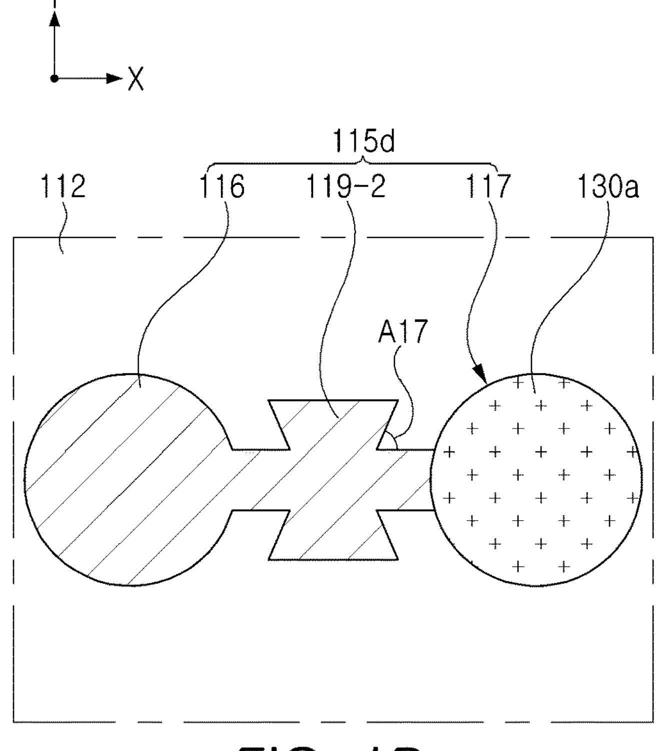
FIG. 1D is an enlarged plan view illustrating a pad of a semiconductor package according to an example embodiment.

For example, referring to FIG. 1D, an angle A17 formed between a first direction (e.g., +X-direction) and an edge facing the first pad portion 117, at the protruding portion 119-2 of the connection portion, may be less than 90 degrees. Accordingly, since the volume of the first recessed region R17 may be secured more efficiently, a portion of the material of the bumps 130*a* to overflow may be more efficiently filled in the first recessed region R17. Therefore, spillage of the material of the bumps 130*a* may be suppressed more efficiently.

Figure 2A:
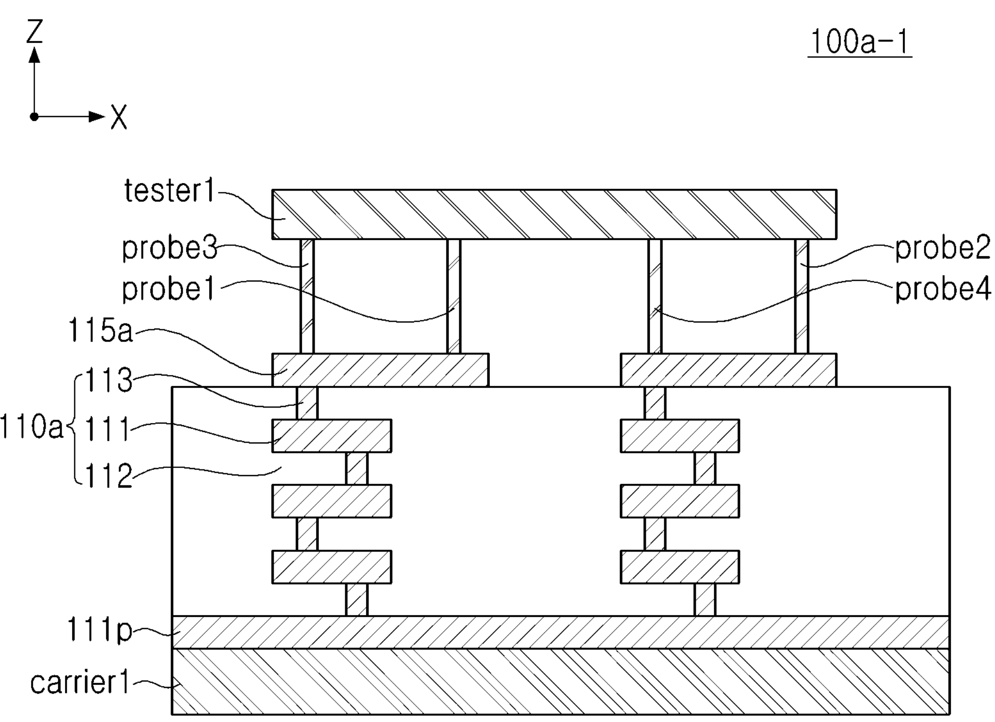
FIG. 2A is a cross-sectional view illustrating a first test structure of a semiconductor package according to an example embodiment.
Figure 2B:
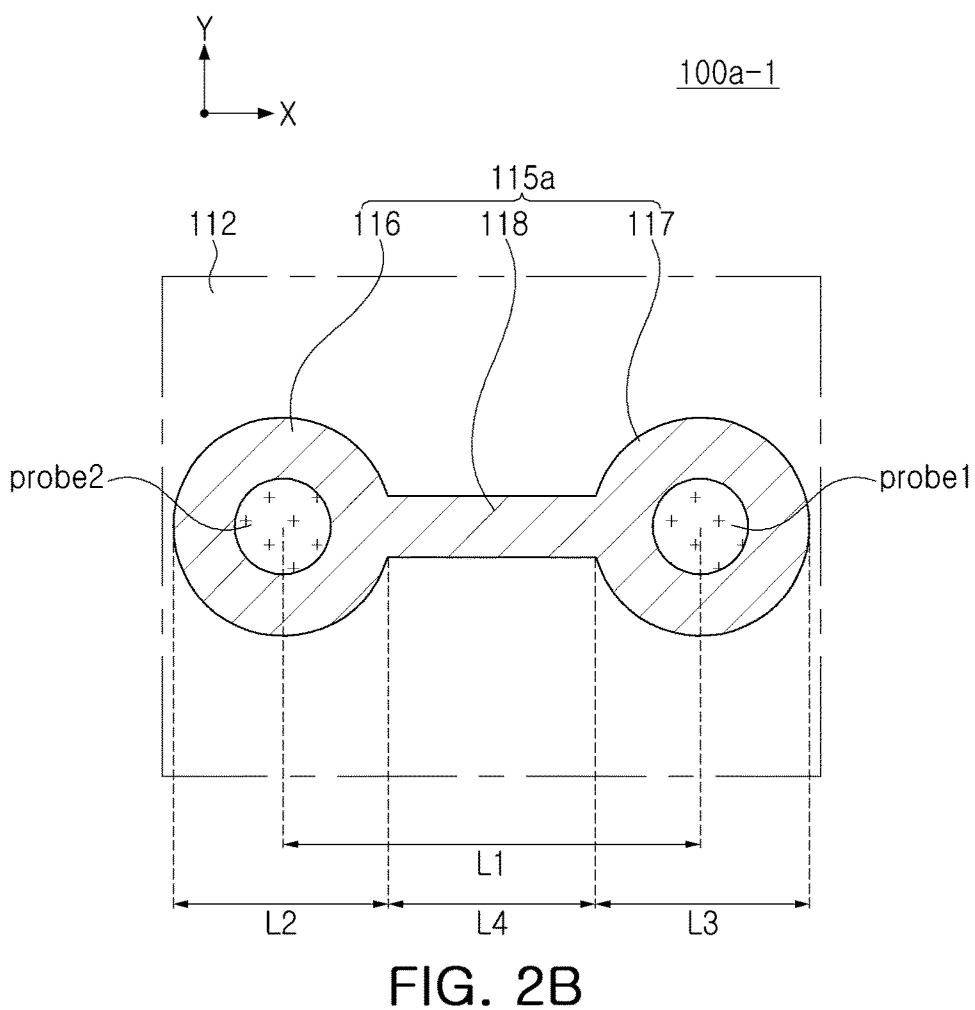
FIG. 2B is an enlarged plan view illustrating a pad of a first test structure of a semiconductor package according to an example embodiment.
Figure 2C:
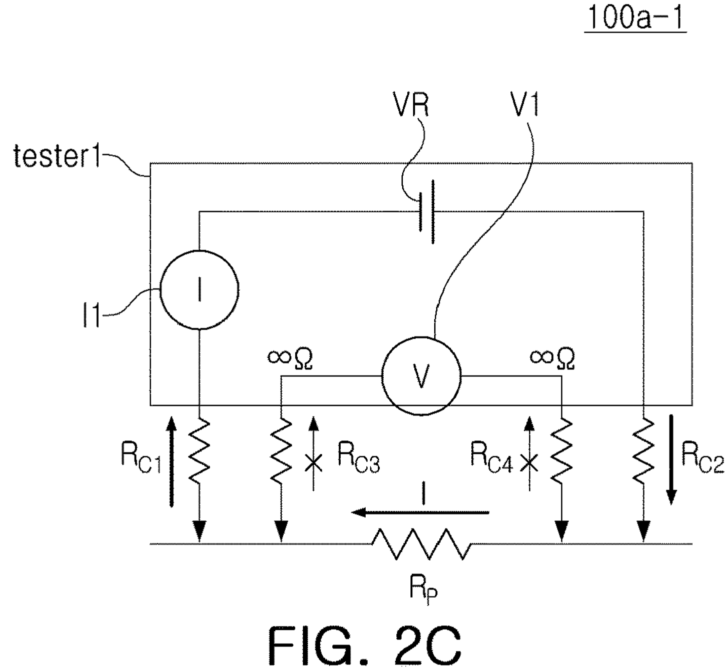
FIG. 2C is a circuit diagram illustrating an equivalent circuit of a first test structure of a semiconductor package according to an example embodiment.
Figures 2D, 2E:
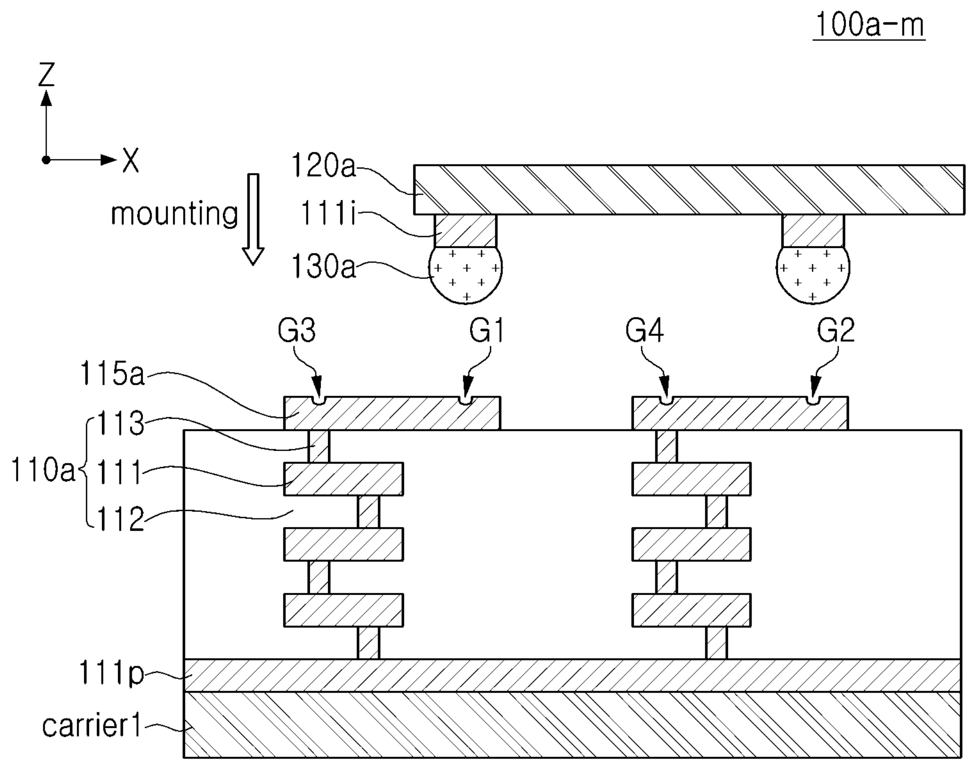
FIG. 2D is a cross-sectional view illustrating a state in which mounting of a semiconductor chip proceeds from a first test structure of a semiconductor package according to an example embodiment.
FIG. 2E is a graph illustrating resistance measurement results of a measuring instrument of a first test structure of a semiconductor package according to an example embodiment.

FIG. 2A is a cross-sectional view illustrating a first test structure of a semiconductor package according to an example embodiment, FIG. 2C is a circuit diagram illustrating an equivalent circuit of a first test structure of a semiconductor package according to an example embodiment, and FIG. 2E is a graph illustrating resistance measurement results of a measuring instrument of a first test structure of a semiconductor package according to an example embodiment.

Referring to FIG. 2A, the semiconductor package 100*a*-1 before mounting the semiconductor chip may include a seed layer 111*p* covering the entire lower surface of the redistribution structure 110*a*. The seed layer 111*p* may electrically connect the pads 115*a* to each other through the redistribution layers 111 and vias 113. The carrier1 may support the redistribution structure 110*a*.

The measurement terminals probe1, probe2, probe3, and probe4 of the measuring device tester1 may be connected to the pads 115*a* in a two-to-one correspondence structure. The measuring device tester1 may detect microcracks in the redistribution layers 111 and vias 113 as well as whether or not the pads 115*a* are electrically connected.

Referring to FIGS. 2A and 2C, the measuring device tester1 may measure the equivalent resistance ($R_P$) of the electrical connection path (rewiring layer and via) of the redistribution structure, and the median resistance of the effective measurement range of the equivalent resistance ($R_P$) may be reduced as the contact resistance $R_{C1}$, $R_{C2}$, $R_{C3}$ and $R_{C4}$ of the measurement terminals is small.

For example, the measuring device tester1 may output constant current (I1) through the measurement terminals (probe1, probe2) based on the power supply (VR), and the equivalent resistance ($R_P$) through the measurement terminals (probe3, probe4) of voltage (V1) may be measured. Since the resistance of the path parallel to the equivalent resistance ($R_P$) may be close to infinity, the current (I) may not flow to the measurement terminals (probe3, probe4).

Therefore, the voltage V1 may not be affected by the contact resistances $R_{C3}$ and $R_{C4}$ of the measurement terminals probe3 and probe4, and the measuring device tester1 may more precisely measure the change in the equivalent resistance $R_P$.

For example, since the contact resistances $R_{C1}$, $R_{C2}$, $R_{C3}$ and $R_{C4}$ may be 4 ohms and the equivalent resistance $R_P$ may be 0.1 ohms, the equivalent resistance $R_P$ may be very small compared to the contact resistances $R_{C1}$, $R_{C2}$, $R_{C3}$ and $R_{C4}$. If the contact resistances $R_{C1}$, $R_{C2}$, $R_{C3}$ and $R_{C4}$ affect the voltage measurement, the change in the measured voltage may be less than 1% even if the equivalent resistance $R_P$ doubles. However, the change rate of the voltage measured by the measuring device tester1 may be substantially the same as the change rate of the equivalent resistance $R_P$. Therefore, the measuring device tester1 may more precisely measure the change in equivalent resistance ($R_P$).

In this manner, when the equivalent resistance ($R_P$) measurement sensitivity of the tester 1 is high, even if the change in equivalent resistance ($R_P$) is relatively low, such as fine cracks in the electrical connection path (rewiring layer and via) of the redistribution structure, the tester1, a measurement voltage V1 capable of detecting the above factor may be provided. Therefore, in the semiconductor package according to an example embodiment, each of the pads provides a plurality of reliability measurement points, thereby providing an environment in which microcracks of electrical connection paths (rewiring layers and vias) may be detected.

For example, the measuring device tester1 may measure the equivalent resistance ($R_P$) of tens of thousands or more electrical connection paths (rewiring layers and vias), and the measured data may be organized as illustrated in the graph of FIG. 2E. The horizontal axis of FIG. 2E is the equivalent resistance ($R_P$), and the vertical axis of FIG. 2E is the number of measurement samples corresponding to the equivalent resistance ($R_P$) of the horizontal axis.

Referring to FIG. 2E, most of the measurement samples may have a resistance of about 0.1 ohm, and a minority of the measurement samples may have a resistance of about 1 ohm. An electrical connection path of the measurement sample having a resistance close to about 1 ohm may include microcracks. The specific resistance may vary depending on the redistribution structure or the degree of integration of the semiconductor chip.

FIG. 2B is an enlarged plan view of a pad of a first test structure of a semiconductor package according to an example embodiment.

Referring to FIGS. 2A and 2B, the measuring terminals probe1 and probe2 of the tester1 may be connected to the center of the first and second pad portions 117 and 116 of the pad 115*a*.

Referring to FIGS. 1C and 2B, the distance D30 between the bumps 130*a* may be shorter than the length of each of the pads 115*b* in a direction (e.g., X-direction) in which the first and second pad portions 117 and 116 face each other. The length may be calculated by [L1+{(L2+L3)/2}] in FIG. 2B. The length may be a length of a major axis of each of the pads 115*b*.

The distance D30 between the bumps 130*a* may be in inverse proportion to the overall degree of integration of the semiconductor package 100*b*. Since the direction in which the first and second pad portions 117 and 116 face each other (e.g., the X-direction) may be oblique to the direction in which the bumps 130*a* face each other, the shortest distance D15 between the pads 115*b* may be substantially independent of the length of the pads 115*b*. Accordingly, the semiconductor package 100*b* according to an example embodiment may have a structure in which each of the pads 115*b* provides a plurality of reliability measurement points, while overall integration of the semiconductor package 100*b* may be secured.

For example, a surface of each of the plurality of pads 115*b* that faces the plurality of bumps may have an aspect ratio exceeding 2. The aspect ratio may be less than 5. The aspect ratio may be a ratio of a maximum length to the width W2 of each of the plurality of pads 115*b*. The width W2 may be perpendicular to the maximum length. The maximum length may be the length [L1+{(L2+L3)/2}] in the direction in which the first and second pad portions 117 and 116 face each other (e.g., the X-direction). The aspect ratio may be a ratio of the length [L1+{(L2+L3)/2}] to the width W2 of the first pad portion 117, and the aspect ratio may be greater than 2 and less than 5. Accordingly, each of the pads 115*b* may stably provide a plurality of reliability measurement points without increasing the size too much. For example, the length [L1+{(L2+L3)/2}] of each of the pads 115*b* in the direction in which the first and second pad portions 117 and 116 face each other (e.g., the X-direction), also referred to as the major axis of each pad, may be greater than 100 μm, and a width W2 of the first pad portion 117 of each of the pads 115*b* may be less than 50 μm.

For example, lengths (L1, L2, L3, L4, L5), widths (W1, W2, W3, W4) and spacing (D15, D30) may be measured by analysis using at least one of a micrometer, transmission electron microscopy (TEM), atomic force microscope (AFM), scanning electron microscope (SEM), focused ion beam (FIB) optical microscope, and surface profiler.

FIG. 2D is a cross-sectional view illustrating a state in which mounting of a semiconductor chip proceeds from a first test structure of a semiconductor package according to an example embodiment. Referring to FIG. 2D, the semiconductor packages 100*a-m* in which the semiconductor chip 120*a* is mounted may have a structure in which the semiconductor chip 120*a* is disposed on the redistribution structure 110*a* through the bumps 130*a*.

The bumps 130*a* may be disposed to be biased (i.e., offset) in a first direction (e.g., +X-direction) from the center of each of the pads 115*a*. Among the vias 113, a via connected closest to the pads 115*a* may be disposed to be biased (i.e., offset) in the second direction (e.g., −X-direction) so as to be located closer to the second pad portion than the first pad portion.

Accordingly, since the electrical path from the bumps 130*a* to the vias 113 may not include an unintended T-connection structure, the occurrence of uncertainty factors in high-frequency characteristics (e.g., impedance characteristics, energy loss characteristics) due to an unintended T-connection structure may be prevented.

Referring to FIG. 2D, surfaces (e.g., upper surfaces) of the pads 115*a* facing the bumps 130*a* may have first grooves G1 and G2 located in one surface of the first pad portion and second grooves G3 and G4 located in one surface of the second pad portion.

The first grooves (G1, G2) and the second grooves (G3, G4) may be evidences of contact between the measuring terminals (probe1, probe2) and the measuring terminals (probe3, probe4) of the measuring devicetester1 of FIG. 2A, respectively (i.e., contact of the measuring terminals (probe1, probe2) and the measuring terminals (probe3, probe4) with the upper surfaces of the pads 115*a* caused the formation of the first grooves (G1, G2) and the second grooves (G3, G4)).

Figures 3A, 3B:
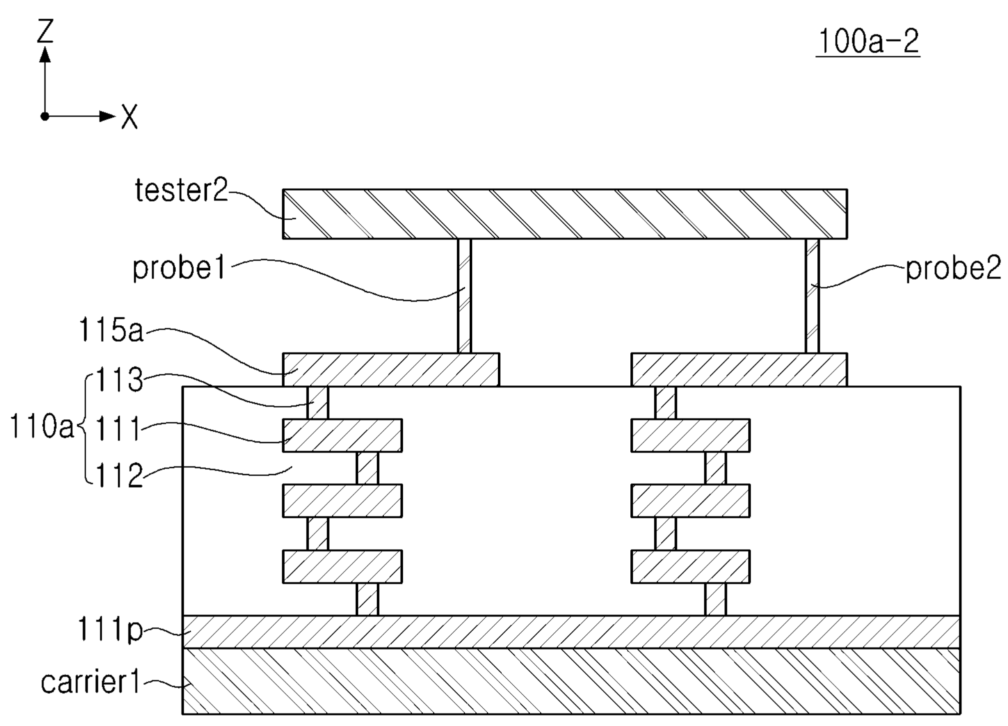
FIG. 3A is a cross-sectional view illustrating a second test structure of a semiconductor package according to an example embodiment.
FIG. 3B is a circuit diagram illustrating an equivalent circuit of a second test structure of a semiconductor package according to an example embodiment.
Figure 3C:
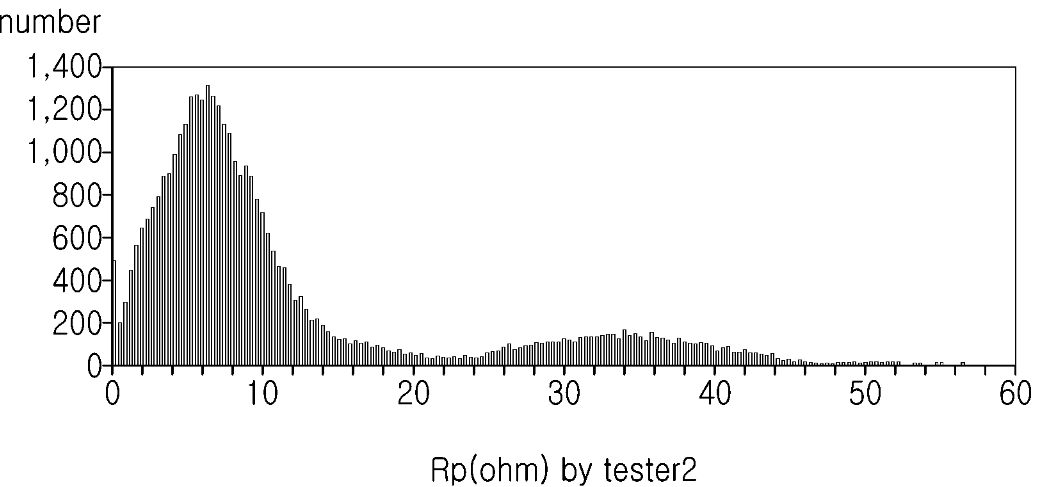
FIG. 3C is a graph illustrating resistance measurement results of a measuring instrument of a second test structure of a semiconductor package according to an example embodiment.
Figure 3D:
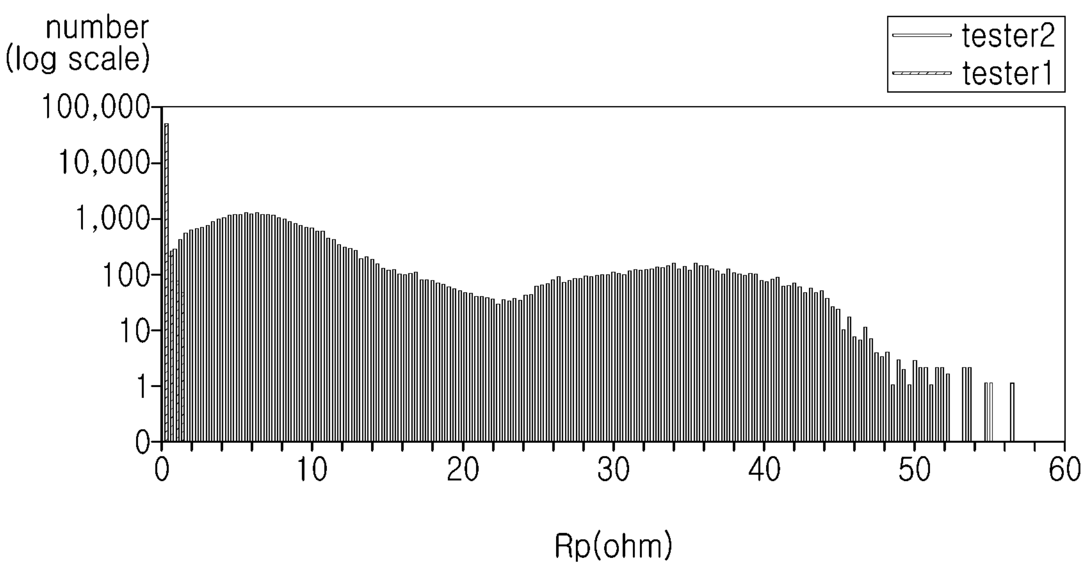
FIG. 3D is a graph illustrating resistance measurement results of the measuring instruments of the first and second test structures of a semiconductor package according to an example embodiment.

FIG. 3A is a cross-sectional view illustrating a second test structure of a semiconductor package according to an example embodiment, FIG. 3B is a circuit diagram illustrating an equivalent circuit of a second test structure of a semiconductor package according to an example embodiment, FIG. 3C is a graph illustrating resistance measurement results of a measuring instrument of a second test structure of a semiconductor package according to an example embodiment, and FIG. 3D is a graph illustrating resistance measurement results of a measuring instrument of first and second test structures of a semiconductor package according to an example embodiment.

Referring to FIG. 3A, if necessary, in the measuring devicetester2, with only two measurement terminals (probe1, probe2), whether or not there is a large crack in the electrical connection path (redistribution layer and vias) of the redistribution structure 110*a* of the semiconductor package 100*a*-2 before the semiconductor chip is mounted may be detected.

Referring to FIG. 3B, the measuring device tester2 may measure the equivalent resistance ($R_P$) of the electrical connection path (rewiring layer and via) of the redistribution structure, and the median resistance of the effective measurement range of the equivalent resistance ($R_P$) may be dependent on the contact resistances ($R_{C1}$, $R_{C2}$) of the measurement terminals.

For example, the measuring devicetester2 may output constant current (I2) through the measurement terminals (probe1, probe2) based on the power source (VR). Through the measurement terminals (probe1, probe2), the contact resistance ($R_{C1}$, $R_{C2}$) of the measurement terminals (probe3, probe4) and the voltage (V2) of the total resistance of the equivalent resistance ($R_P$) may be measured.

For example, the measuring device tester2 may measure the equivalent resistance ($R_P$) of tens of thousands or more electrical connection paths (rewiring layers and vias), and the measurement data may be organized as illustrated in the graph of FIG. 3C. The horizontal axis of FIG. 3C is the equivalent resistance ($R_P$), and the vertical axis of FIG. 3C is the number of measurement samples corresponding to the equivalent resistance ($R_P$) of the horizontal axis.

Referring to FIG. 3C, most of the measured samples may have a resistance of about 8.1 ohms, and a minority of the measured samples may have a resistance of about 30 ohms. The electrical connection path of the measurement sample close to a resistance of about 30 ohms may contain large cracks. The specific resistance may vary depending on the redistribution structure or the degree of integration of the semiconductor chip.

FIG. 3D comprehensively shows the data of FIG. 2E and the data of FIG. 3C, the test structure of the semiconductor package according to an example embodiment, may be appropriately selected according to the required effective measurement range.

Figure 4A:
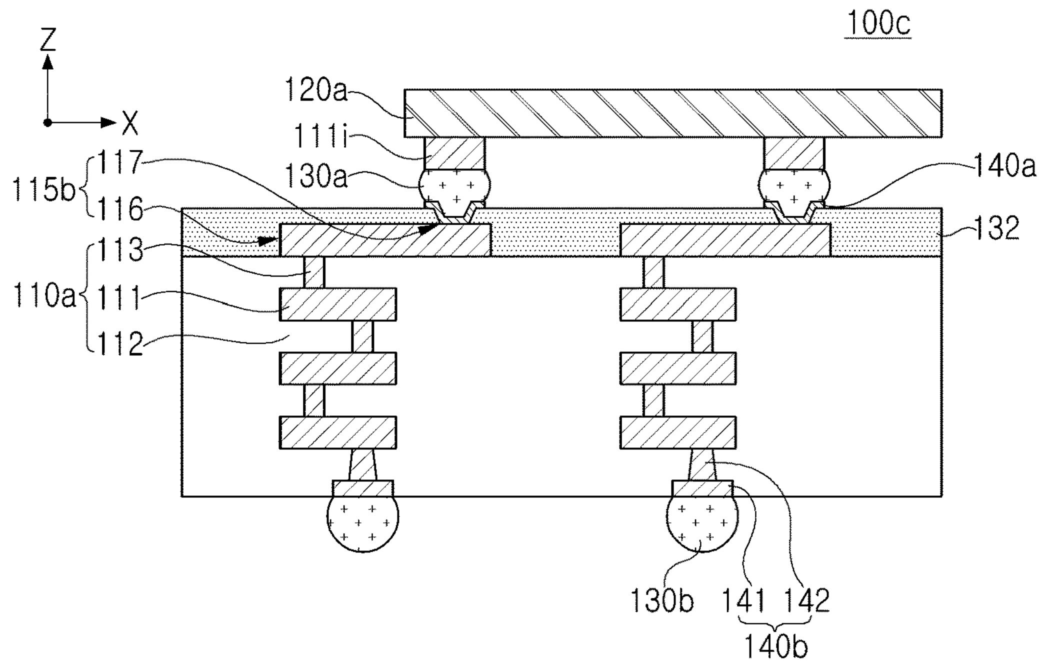
FIG. 4A is a cross-sectional view illustrating a structure in which additional pads are further disposed in a semiconductor package according to an example embodiment.
Figure 4B:
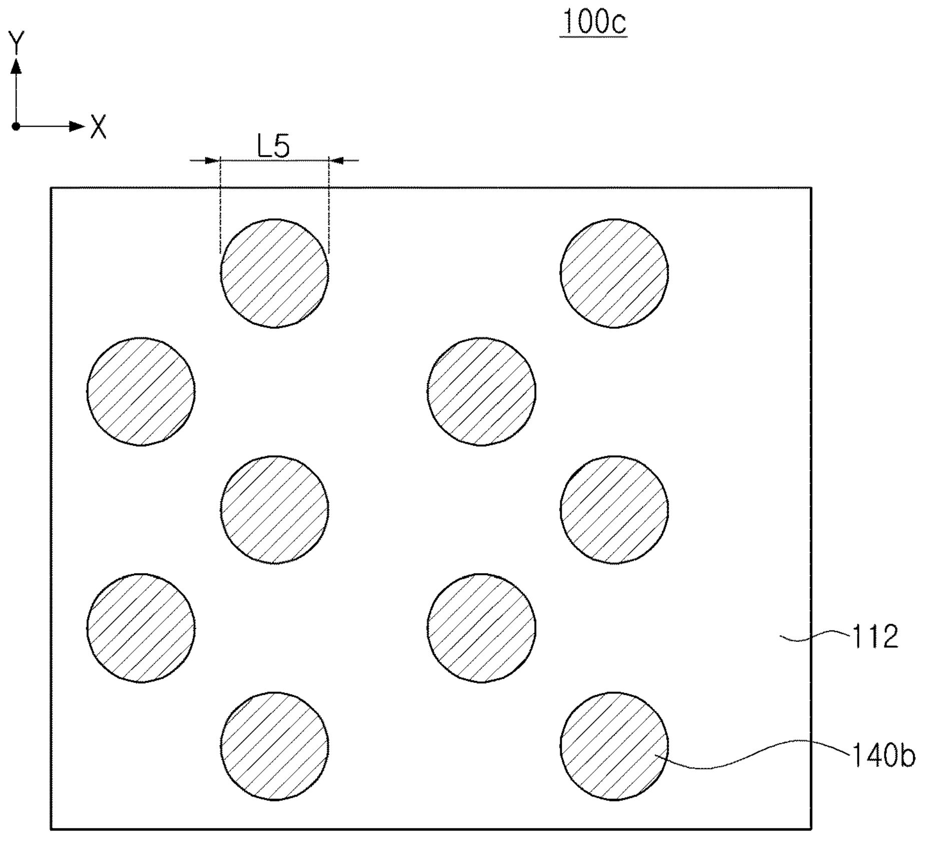
FIG. 4B is a plan view illustrating an additional pad of a semiconductor package according to an example embodiment.

FIG. 4A is a cross-sectional view illustrating a structure in which additional pads are further disposed in a semiconductor package according to an example embodiment, and FIG. 4B is a plan view illustrating an additional pad of the semiconductor package according to an example embodiment.

Referring to FIGS. 4A and 4B, the semiconductor package 100*c* according to an example embodiment may further include additional pads 140*b* disposed on the other surface (e.g., lower surface) of the redistribution structure 110*a*. For example, the additional pads 140*b* may include pad portions 141 and via portions 142.

The additional pads 140*b* may be connected to additional bumps 130*b*, and the additional bumps 130*b* may be connected to a printed circuit board or an additional redistribution structure. Since the diameter L5 of the additional pads 140*b* may be greater than that of the pads 115*b*, each of the additional pads 140*b* may not require a plurality of reliability measuring points. Accordingly, an aspect ratio of one surface of the additional pads 140*b* may be closer to 1 than an aspect ratio of one surface of the pads 115*b* disposed on one surface of the redistribution structure 110*a*. For example, an aspect ratio closer to 1 may mean a shape closer to a circular shape.

Figure 5A:
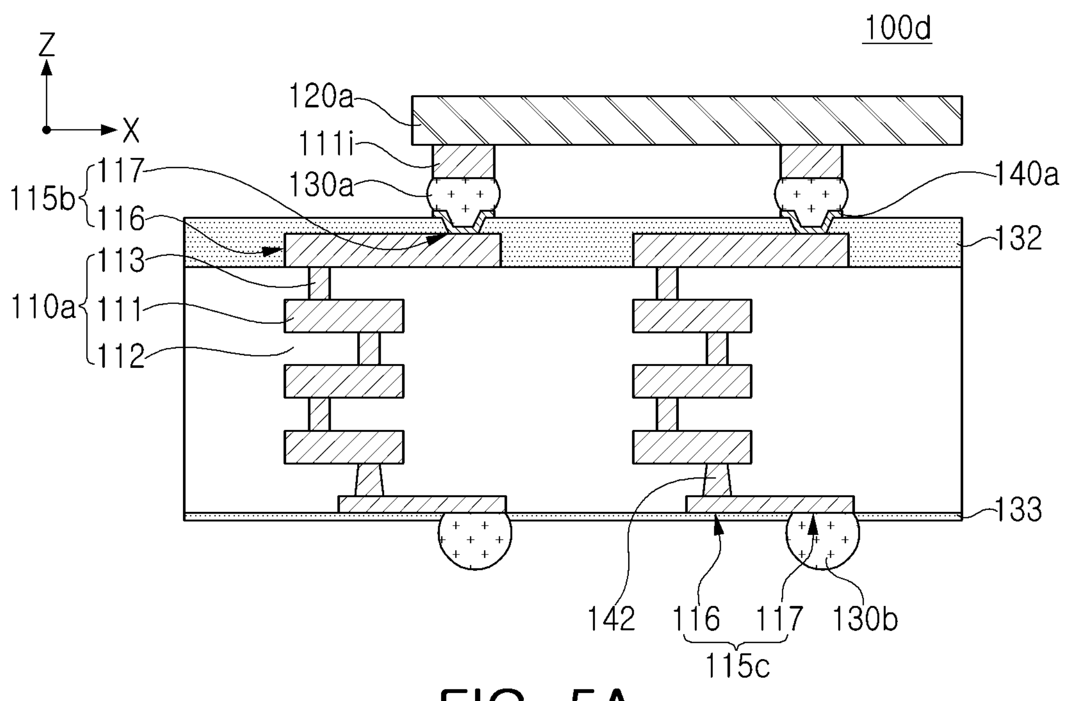
FIG. 5A is a cross-sectional view illustrating a structure in which a solder mask layer and UBM (Under Bump Metallurgy) structures are further disposed in a semiconductor package according to an example embodiment.

FIG. 5A is a cross-sectional view illustrating a structure in which a solder mask layer and UBM (Under Bump Metallurgy) structures are further disposed in a semiconductor package according to an example embodiment. Referring to FIG. 5A, a semiconductor package 100*d* according to an example embodiment may further include solder mask layers 132 and 133 and UBM structures 140*a*.

The solder mask layer 132 may be disposed on one surface (e.g., an upper surface) of the redistribution structure 110*a* to cover a portion of each of the pads 115*b*. For example, the solder mask layers 132 and 133 may contain the same insulating material as that of a conventional solder resist.

Since the second pad portion 116 may not provide an arrangement space for the bumps 130*a*, an area where the solder mask layer 132 covers the second pad portion 116 may be larger than an area covering the first pad portion 117. For example, the solder mask layer 132 may completely cover the second pad portion 116.

The UBM structures 140*a* may be electrically connected between the bumps 130*a* and the pads 115*b*. For example, the UBM structures 140*a* may contain the same metal material as that of conventional Under Bump Metallurgy (UBM).

Since the second pad portion 116 may not provide an arrangement space for the bumps 130*a*, each of the UBM structures 140*a* may be displaced from the center of each of the pads 115*b* in a first direction (e.g., a +X-direction). For example, the UBM structures 140*a* may vertically overlap only the first pad portion 117 and may not vertically overlap the second pad portion 116, as illustrated in FIG. 5A.

Depending on the design, the additional pads 115*c* disposed on the other surface (e.g., the lower surface) of the redistribution structure 110*a* may also include the first and second pad portions 117 and 116, each of the additional pads 115*c* may provide a plurality of reliability measuring points. Whether the additional pads 115*c* include the first and second pad portions 117 and 116 may vary depending on the size of the additional pads 115*c* or a specific structure of a connection object (e.g., a redistribution structure). For example, the probability that the additional pads 115*c* include the first and second pad portions 117 and 116 may increase as the distance between the additional bumps 130*b* is shortened.

Figure 5B:
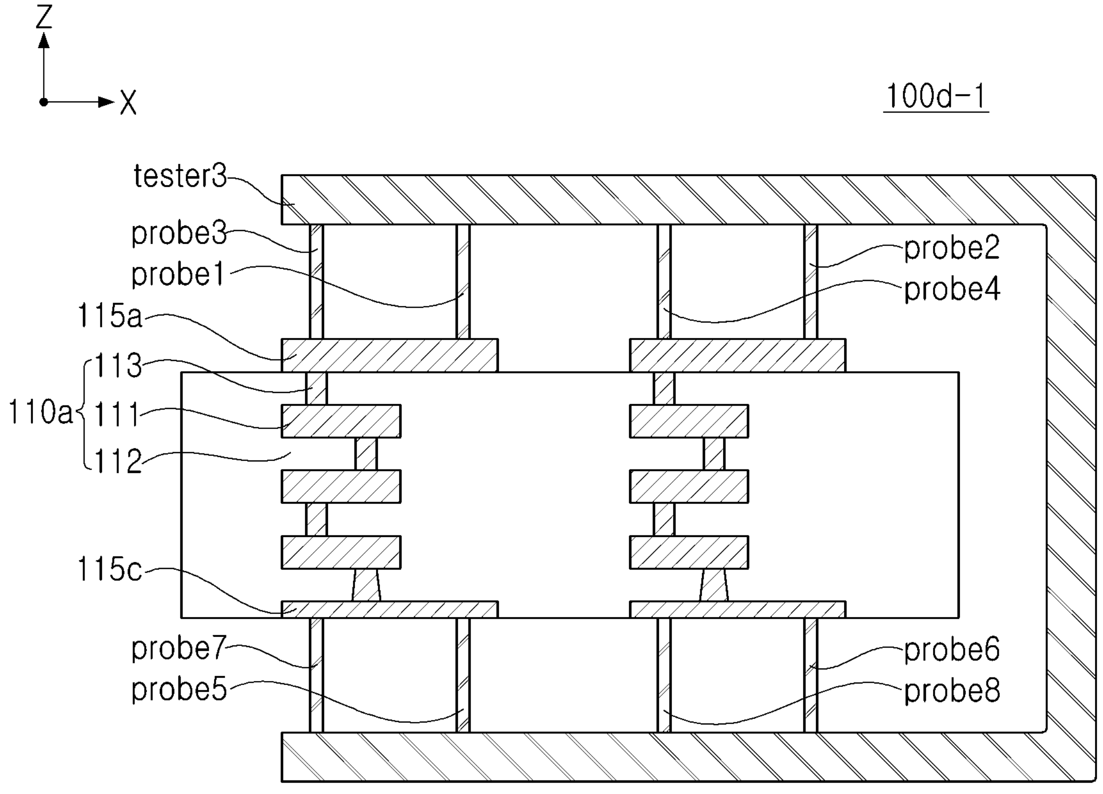
FIG. 5B is a cross-sectional view illustrating a third test structure of a semiconductor package according to an example embodiment.

FIG. 5B is a cross-sectional view illustrating a third test structure of a semiconductor package according to an example embodiment.

Referring to FIG. 5B, if necessary, in the measuring devicetester3, equivalent resistance, which is an indicator of the reliability of the electrical connection path between the upper measurement terminals (probe1, probe2, probe3, probe4) and the lower measurement terminals (probe5, probe6, probe7, probe8), may be measured.

Accordingly, the reliability of the electrical connection path between the upper and lower surfaces of the redistribution structure 110*a* may be measured. In addition, the reliability of the electrical connection path of the redistribution structure 110*a* may be measured even when at least a portion of the seed layer 111*p* illustrated in FIG. 2A is removed.

Figures 6A, 6B:
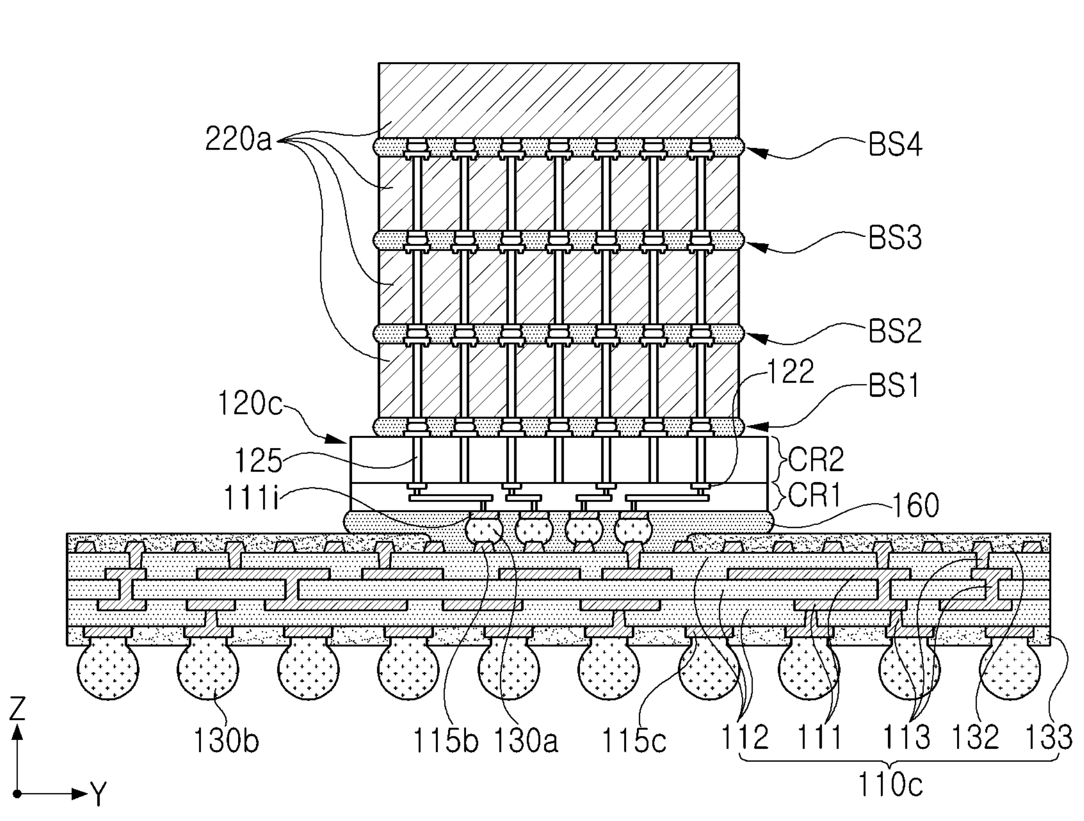
FIGS. 6A and 6B are cross-sectional views illustrating a redistribution structure of a semiconductor package and various structures of a semiconductor chip according to an example embodiment.

FIGS. 6A and 6B are cross-sectional views illustrating a redistribution structure of a semiconductor package and various structures of a semiconductor chip according to an example embodiment.

Referring to FIG. 6A, the semiconductor package 100*e* according to an example embodiment may have a fan-in structure in which the redistribution structure 110*b* and the semiconductor chip 120*b* are completely vertically overlapped, and may include pads 115*b*, which may be implemented identically to the pads 115*b* of FIG. 1C, and may also include UBM structures 140*c*.

The non-conductive film layer 160 that may be included in the semiconductor package 100*a* may be disposed to surround the bumps 130*c* on the lower surface of the redistribution structure 110*b*. The non-conductive film layer 160 may be referred to as an underfill layer, may include a non-conductive polymer, and may include a non-conductive paste (NCP).

Referring to FIG. 6B, the semiconductor chip 120*c* of the semiconductor package 100*f* according to an example embodiment may be disposed between the semiconductor chips 220*a* and the redistribution structure 110*c*. The additional bumps 130*b* may be connected between the semiconductor chip 120*c* and the redistribution structure 110*c*.

For example, the combined structure of the semiconductor chip 120*c* and the semiconductor chips 220*a* may be a 3D integrated circuit structure as a SIP, the semiconductor chip 120*c* may be a logic semiconductor chip, and the semiconductor chips 220*a* may be memory semiconductor chips.

For example, the semiconductor chip 120*c* may have a lower first region CR1 and an upper second region CR2, and may further include device layers 122 and through vias 125. The first region CR1 may be a device region, and may be a region in which elements such as transistors and/or memory cells constituting a semiconductor chip are formed based on the second region CR2. The second region CR2 may be a substrate region, and may include, for example, a semiconductor material such as silicon (Si).

The device layers 122 may be disposed in the first region CR1 to configure the devices. The through-vias 125 may pass through the second region CR2 of the semiconductor chip 120*c*. In some embodiments, the through-vias 125 may further penetrate at least a portion of the first region CR1. The through-vias 125 may be electrically connected to the device layers 122 of the first region CR1, and an electrical connection may be provided between the semiconductor chips 220*a* and the redistribution structure 110*c*. The through-vias 125 may be made of a conductive material, and may include, for example, at least one of tungsten (W), aluminum (Al), and copper (Cu). The redistribution structure 110*c* may have the same structure as the redistribution structure of FIG. 1A.

The semiconductor chips 220*a* may be stacked and disposed along the z direction on the semiconductor chip 120*c*. The semiconductor chips 220*a* may include through-vias 125 except for uppermost semiconductor chips. A first connection region BS1 is formed between the semiconductor chip 120*c* and the semiconductor chips 220*a*, and second to fourth connection regions BS2, BS3, and BS4 may be positioned between the semiconductor chips 220*a*, respectively. Although not specifically illustrated, the first to fourth connection regions BS1, BS2, BS3, and BS4 may have at least a portion substantially the same as a connection region between the redistribution structure 110*c* and the semiconductor chip 120*c*. For example, each of the first to fourth connection regions BS1, BS2, BS3, and BS4 includes bumps arranged horizontally, and may include pads disposed above and below the bumps, and a non-conductive film layer surrounding the bumps may be included.

As set forth above, according to an example embodiment, reliability of measurement efficiency of an electrical connection path of a semiconductor package may be improved.

While example embodiments have been illustrated and described above, it will be apparent to those skilled in the art that modifications and variations could be made without departing from the scope of the present inventive concept as defined by the appended claims.

What is claimed is:

1. A semiconductor package comprising:

a redistribution structure comprising at least one redistribution layer and at least one insulating layer alternately stacked;

a semiconductor chip electrically connected to the at least one redistribution layer; and a plurality of bumps electrically connected to the at least one redistribution layer and arranged on a first surface of the redistribution structure, wherein the at least one redistribution layer comprises a plurality of pads arranged to face the plurality of bumps, and wherein each pad comprises:

a first pad portion offset from a center of the pad in a first direction and arranged to face one of the plurality of bumps;

a second pad portion offset from the center of the pad in a second direction different from the first direction; and a connection portion connecting the first and second pad portions, wherein the connection portion comprises a protruding portion that defines a first recessed region adjacent to the first pad portion and a second recessed region adjacent to the second pad portion.

2. The semiconductor package of claim 1, wherein a width of the protruding portion is greater than a width of either the first or second recessed regions.

3. The semiconductor package of claim 2, wherein the width of the protruding portion is smaller than a width of the first pad portion.

4. The semiconductor package of claim 2, wherein the protruding portion comprises an edge facing the first pad portion, and wherein an angle formed between the edge of the protruding portion and the first direction is less than 90 degrees.

5. The semiconductor package of claim 1, further comprising a solder mask layer covering a portion of each of the plurality of pads, wherein an area of the solder mask layer covering the second pad portion of each of the plurality of pads is greater than an area of the solder mask layer covering the first pad portion of each of the plurality of pads.

6. The semiconductor package of claim 1, further comprising a plurality of Under Bump Metallurgy (UBM) structures, each UBM structure positioned between and electrically connecting a respective one of the plurality of bumps and the first pad portion of a respective one of the plurality of pads, wherein each of the plurality of UBM structures is offset in the first direction from the center of a respective one of the plurality of pads.

7. The semiconductor package of claim 1, wherein the redistribution structure further comprises a plurality of vias electrically connected to the at least one redistribution layer and extending through the at least one insulating layer, and wherein a respective one of the plurality of vias that is closest to a respective one of the plurality of pads is located closer to the second pad portion than to the first pad portion of the respective one of the plurality of pads.

8. The semiconductor package of claim 1, further comprising a plurality of additional pads on a second surface of the redistribution structure, wherein an aspect ratio of a surface of each of the plurality of additional pads is closer to 1 than an aspect ratio of a surface of each of the plurality of pads on the first surface of the redistribution structure.

9. The semiconductor package of claim 1, wherein an aspect ratio, which is a ratio of a length of a major axis of each of the plurality of pads to a width of the first pad portion of each of the plurality of pads, is greater than 2 and less than 5.

10. The semiconductor package of claim 9, wherein the length of the major axis of each of the plurality of pads is greater than 100 μm, and wherein a width of the first pad portion of each of the plurality of pads is less than 50 μm.

11. The semiconductor package of claim 1, wherein the semiconductor chip is electrically connected to the redistribution structure through the plurality of bumps.

12. The semiconductor package of claim 1, wherein a distance between adjacent ones of the plurality of bumps is shorter than a length of a major axis of each of the plurality of pads.

13. The semiconductor package of claim 1, wherein each of the plurality of pads comprises a first groove in a surface of the first pad portion and a second groove in a surface of the second pad portion.

14. A semiconductor package comprising:

a redistribution structure comprising at least one redistribution layer and at least one insulating layer alternately stacked;

a semiconductor chip electrically connected to the at least one redistribution layer; and a plurality of bumps electrically connected to the at least one redistribution layer and arranged on one surface of the redistribution structure, wherein the at least one redistribution layer comprises a plurality of pads arranged to face the plurality of bumps, and wherein a surface of each of the plurality of pads that faces the plurality of bumps, has an aspect ratio greater than 2 and comprises first and second grooves.

15. The semiconductor package of claim 14, wherein the semiconductor chip is electrically connected to the redistribution structure through the plurality of bumps, and wherein each of the plurality of bumps are offset in a first direction from a center of a respective one of the plurality of pads.

16. The semiconductor package of claim 15, wherein the redistribution structure further comprises a plurality of vias electrically connected to the at least one redistribution layer and extending through the at least one insulating layer, and wherein a respective one of the plurality of vias that is closest to a respective one of the plurality of pads is connected to the respective one of the plurality of pads at a location offset from the center of the respective one of the plurality of pads in a second direction different from the first direction.

17. The semiconductor package of claim 16, wherein a distance between adjacent ones of the plurality of bumps is shorter than a length of a major axis of each of the plurality of pads.

18. The semiconductor package of claim 17, wherein each pad comprises, a first pad portion offset from a center of the pad in a first direction;

a second pad portion offset from the center of the pad in a second direction; and a connection portion connecting the first and second pad portions, wherein the connection portion comprises a protruding portion that defines a first recessed region adjacent to the first pad portion and a second recessed region adjacent to the second pad portion.

19. A semiconductor package comprising:

a redistribution structure comprising at least one redistribution layer and at least one insulating layer alternately stacked;

a semiconductor chip electrically connected to the at least one redistribution layer; and a plurality of bumps electrically connected to the at least one redistribution layer and arranged on one surface of the redistribution structure, wherein the at least one redistribution layer comprises a plurality of pads arranged to face the plurality of bumps, wherein each of the plurality of pads comprises a surface contacting a respective bump of the plurality of bumps, the surface having an aspect ratio exceeding 2, and wherein a distance between adjacent ones of the plurality of bumps is shorter than a length of a major axis of each of the plurality of pads.

20. The semiconductor package of claim 19, wherein the semiconductor chip is electrically connected to the redistribution structure through the plurality of bumps, wherein the redistribution structure further comprises a plurality of vias electrically connected to the at least one redistribution layer and extending through the at least one insulating layer, wherein the plurality of bumps are arranged so as to be offset in a first direction from a center of each of the plurality of pads, and wherein a respective one of the plurality of vias that is closest to a respective one of the plurality of pads is connected to the respective one of the plurality of pads at a location offset from a center of the respective one of the plurality of pads in a second direction different from the first direction.

* * * * *